United States Patent [19]
Schneider et al.

[11] Patent Number: 5,887,150
[45] Date of Patent: Mar. 23, 1999

[54] SCSI CONTROLLER HAVING OUTPUT DRIVER WITH SLEW RATE CONTROL

[75] Inventors: Thomas R. Schneider, Anaheim; Takashi Asami, Mission Viejo, both of Calif.

[73] Assignee: Adaptec, Inc., Milpitas, Calif.

[21] Appl. No.: 882,199

[22] Filed: Jun. 25, 1997

[51] Int. Cl.[6] .......................... G06F 13/00; H03K 17/56
[52] U.S. Cl. .......................... 395/306; 326/91; 327/170
[58] Field of Search .................. 395/306; 365/189.11; 327/170; 326/23, 26, 27, 91

[56] References Cited

U.S. PATENT DOCUMENTS

| | | | |
|---|---|---|---|
| 3,961,279 | 6/1976 | Davis | 330/253 |
| 5,187,686 | 2/1993 | Tran et al. | 365/189.11 |
| 5,266,847 | 11/1993 | Kuo | 307/296.6 |
| 5,519,338 | 5/1996 | Campbell et al. | 326/27 |
| 5,537,070 | 7/1996 | Risinger | 327/170 |
| 5,703,496 | 12/1997 | Sabin | 326/27 |

*Primary Examiner*—Ayaz R. Sheikh
*Assistant Examiner*—Ario Etienne
*Attorney, Agent, or Firm*—Christie, Parker & Hale, LLP

[57] ABSTRACT

An integrated circuit provides for adjustable slew rate control for both rising and falling edges of an output provided to an SCSI bus. Slew rate is controlled by adaptively varying the charge and/or discharge rate of the gate electrode of an output driver's N-channel pull-down transistor. Charge time and, thus, the falling edge slew rate, is adaptively varied by selectively adding the current source P-channel transistors to a current bus coupled to the gate electrode of the pull-down transistor. Similarly, the discharge rate and, thus, the rising edge slew rate, is adaptively adjusted by selectively switching current sink transistors on to the current bus coupled to the pull-down transistor's gate electrode. The amount of currents sourced or sunk is determined by varying the W/L ratios of both the current source and current sink transistors.

17 Claims, 3 Drawing Sheets

SCSI CONTROLLER HAVING OUTPUT DRIVER WITH SLEW RATE CONTROL

FIELD OF THE INVENTION

The present invention relates generally to electronic systems having an SCSI interface. In particular, the invention relates to an integrated circuit, adapted for connection to an SCSI bus, in which the output driver slew rate is adjusted depending on the bus loading.

BACKGROUND OF THE INVENTION

The SCSI interface may be best described as a device independent input/output bus which allows a variety of peripheral devices to be connected to a personal computer system. SCSI refers to Small Computer Systems Interface, and was initially developed to provide a disk drive interface that supported logical addressing of data rather than the more prevalent physical addressing. In addition, the SCSI interface was developed to transfer information in parallel, byte-wise fashion instead of serially, thus, ending certain compatibility difficulties associated with developing new disk drive technologies and bringing them to the marketplace. The electrical characteristics and signal protocols of the SCSI interface were developed in such a manner that the requirements of various peripheral devices could be accommodated with relative ease and flexibility. In particular, the SCSI interface protocol defines a number of commands which are available for accessing and querying a particular peripheral device regarding the parameter set required for the device to operate correctly. This particular feature of the SCSI interface makes it possible for a system designer to write a software device driver program for a generalized peripheral device, without regard to device specific parameter set details.

In accordance with the various versions of the SCSI interface, such as SCSI-1, SCSI-2, and SCSI-3, anywhere from 8 to 32 individual peripheral devices can be addressed on an SCSI bus depending on whether the bus is an 8-bit bus, a 16-bit bus or a 32-bit bus. These devices are generally categorized as initiators and targets, with any particular peripheral device able to play either role at a particular point in time. Specifically, a peripheral device functioning as an initiator, is a device that initiates an information transaction or data transfer by giving another peripheral device a particular task to perform. An example of an initiator might well be the SCSI host adapter of a personal computer system, while an example of a typical target device might well be a rotating disk data storage system such as a hard disk drive or CD-ROM. A target peripheral device may be thus seen as the device which carries out the task identified by the initiator.

As was mentioned previously, and as is depicted in the generalized block diagrams of FIGS. 1A, 1B and 1C, an SCSI interface bus configuration may have any combination of initiator and target devices, so long as the total does not exceed the number allowed by the bus width (8, 16, or 32). Particular basic SCSI configurations illustrated in FIG. 1A include a single initiator, single target configuration such as a computer system host adapter coupled to an SCSI hard disk controller; a single initiator, multiple target configuration, such as a computer system host adapter coupled to a hard disk drive and a CD-ROM is depicted in FIG. 1B; and FIG. 1C illustrates a multiple initiator, multiple target configuration, such as might obtain in a local area network in which multiple computer systems are connected to multiple printers, disk drives, CD-ROMs, and the like.

The SCSI bus may be from 8 to 32 bits wide, depending on configuration, with the standard SCSI bus being an 8-bit wide bus comprising 18 signals. In accord with the SCSI specification, these signals are either single ended active-low signals or differential signals defined by output driver circuitry on the initiator and target devices. The reason for this signal convention is that the SCSI bus is required to be terminated at both ends for proper operation. Passive termination is typically provided by termination resistors while active termination may be provided by any number of means well understood by those having skill in the art. In single ended mode terminators (whether active or passive) are coupled to a power supply which is preferably 5 volts, but may range from about 3.25 to about 6.0 volts, and function to pull-up the signal lines of the bus to about 2.5 to about 3.0 volts, thereby holding the signals inactive until an output driver pulls-down the signal line to an active low. Advantageously, termination in combination with an active-low signal level, makes possible to leave devices connected to the bus whose power has been turned-off. However, as will be described in greater detail below, termination often impacts the ability of an output driver to meet certain other SCSI signal conventions, particularly with regard to slew rate.

Slew rate is defined as the time rate of change of the rising or falling edge of a signal. The SCSI specification for slew rate is 500 millivolts per nanosecond (maximum) for both rise time and fall time, particularly for the data signals (DB(0)–DB(7)), request (REQ), and acknowledge (ACK). Particularly with regard to signal rise times, once a particular signal is inactive, i.e. no longer low, terminators tend to pull the bus up to approximately 2.5 volts very quickly and very often with slew rates in excess of 500 millivolts per nanosecond. In addition, this tendency is magnified when the SCSI bus is relatively unpopulated, often termed lightly loaded. Such a situation would obtain where an SCSI bus was coupled between a single host initiator and a single target device, as depicted in FIG. 1A.

Light bus loading also has the effect of reducing the number of multiple, parallel, parasitic capacitances coupled to the bus which, in turn, increases the slew rate of an active-low going signal, i.e., fall time, to values in excess of 500 millivolts per nanosecond. Conversely, highly loaded buses exhibit the opposite behavior, slew rates for both rising and falling edges dropping to values considerably below 500 millivolts per nanosecond. Such a situation would obtain where an SCSI bus was coupled between multiple initiators and multiple target devices, as depicted in FIG. 1C. While low slew rate values are not necessarily in violation of the SCSI specification, low slew rate values are disadvantageous in SCSI bus systems operating at modern-day speeds in the range of about 20 to 40 megahertz (as in the FAST 20 and FAST 40 protocol domains).

There have been various attempts over the past few years to design an output driver which takes into account the above-mentioned behavior. Most of these output drivers include highly complex circuitry, including precision voltage references. While effective to a degree, precision voltage references must be designed to take process variations into account and, in addition, consume a rather large portion of an output driver floor plan. The complexity of these circuits and their inefficient silicon utilization, are rather disadvantageous when considered in light of the modern trend toward greater and greater functionality in smaller and smaller chip areas.

Accordingly, it will be seen that there is a need for some means to condition the output signal slew rate performance of an output driver of a for example, SCSI controller, to take into account the loading flexibility of an SCSI bus as well as take into account the effects of termination (active or passive) on the pull-up characteristics of the bus. Such an output driver should have an adjustable slew rate controller such that the slew rate for both rise times and fall times is controlled to a value proximate to the SCSI specification value, without exceeding the specification or falling substantially below it. The slew rate control should be adjustable to take into account loading characteristics of the SCSI bus, with one of a number of different slew rate options being selectable depending on whether the bus is lightly loaded, heavily loaded, or somewhere in between. In addition, slew rate control should comprise circuitry which is simple and which may be implemented without consuming large portions of valuable silicon real estate.

SUMMARY OF THE INVENTION

The present invention provides for an integrated circuit which adaptively adjusts the slew rate for rising and falling edges of an output driver signal, where the output driver is coupled to a terminated SCSI bus. The integrated circuit includes an output driver which has an N-channel pull-up transistor and an N-channel pull-down transistor, with the pull-down transistor having a turn-on slew rate in operative response to a charge current provided on its gate terminal. The pull-down transistor further has a turn-off slew rate in operative response to discharge current conducted from the gate terminal of the pull-down transistor. The gate terminal of the pull-down transistor is coupled to a current bus. Selected ones of a multiplicity of charge and discharge currents are provided to the current bus, with each respective one of the multiplicity of currents causing the pull-down transistor to exhibit a corresponding slew rate in operative response thereto.

In one aspect of the invention, a multiplicity of source currents is provided to the current bus by a parallel array of stacked P-channel transistors, with each P-channel transistor stack comprising a control transistor connected in series with a source current transistor. Each of the control transistor gate electrodes is connected to a respective one of a multiplicity of mutually exclusive control signals, each control signal activating a respective one of the control transistors, thus activating the respective P-channel transistor stack so as to provide a source current to the current bus.

In another aspect of the invention, a multiplicity of sink currents is provided to the current bus by a parallel array of stacked N-channel transistors, each N-channel transistor stack comprising a control transistor connected in series with a current sink transistor. Each control transistor gate electrode is connected to a respective one of a multiplicity of mutually exclusive control signals, each control signal activating a respective one of the control transistors, thus activating the respective N-channel transistor stack so as to sink current from the current bus.

Each of the source and sink transistors are constructed with a W/L ratio, the W/L ratio of the source and sink currents in each array increasing such that each respective source transistor sources a pre-determined and different amount of current than a next respective source transistor and such that each respective sink transistor sinks a pre-determined and different amount of current than a next respective sink transistor. These differing W/L ratios determine the speed at which the N-channel pull-down transistor of the output driver can be charged and discharged, thus adjusting the turn-on and turn-off slew rate respectively.

BRIEF DESCRIPTION OF THE DRAWINGS

These and other features, aspects, and advantages of the present invention will be more fully understood when considered with respect to the following detailed description, appended claims and accompanying drawings, wherein:

DETAILED DESCRIPTION OF THE INVENTION

Figure 1A:
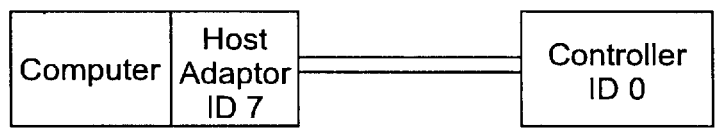
FIG. 1A is a semi-schematic block level diagram of a lightly loaded SCSI bus including a single target and a single initiator.
Figure 1B:
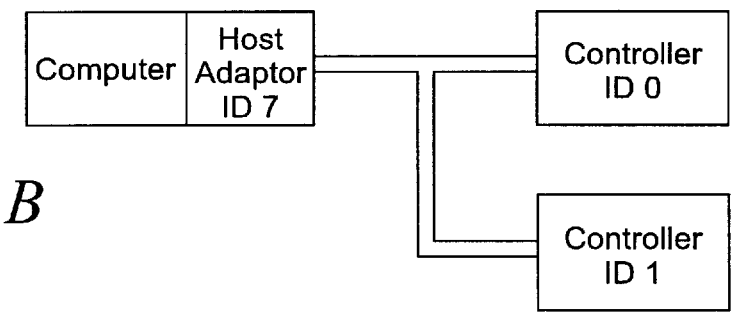
FIG. 1B is a semi-schematic block level diagram of a moderately populated SCSI bus including a single initiator and multiple target devices.

In accordance with practice of the present invention, an SCSI controller chip such as the 61C96H, manufactured and sold by Adaptec, Inc. of Milpitas, Calif., communicates with an SCSI bus by means of an output driver circuit which employs an efficient design for allowing a user to control the output driver's slew rate. This efficient design is advantageous when a user knows the loading characteristics of the system to which a device comprising the controller will be connected. If the device is to be connected to a lightly loaded system, such as the single initiator, single target paradigm depicted in FIG. 1A, a relatively low slew rate on the output driver would normally be deemed sufficient. Relatively slow slew rates also assist in minimizing transmission line reflections on an SCSI cable.

Figure 1C:
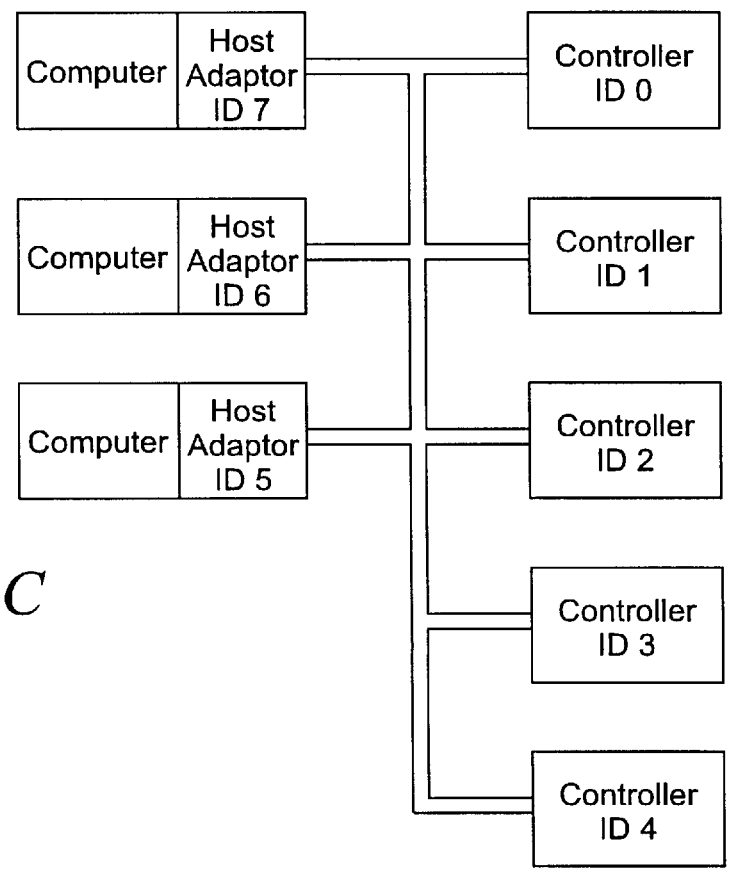
FIG. 1C is a semi-schematic block level diagram of a heavily populated SCSI bus including multiple initiators and multiple target devices.

In a heavily loaded system, such as the multiple initiator, multiple target paradigm as depicted in FIG. 1C, the user may wish to compensate for the heavier system load by increasing the slew rate of the output driver to thereby maintain the integrity of the output signal comfortably above some marginal level.

Figure 2:
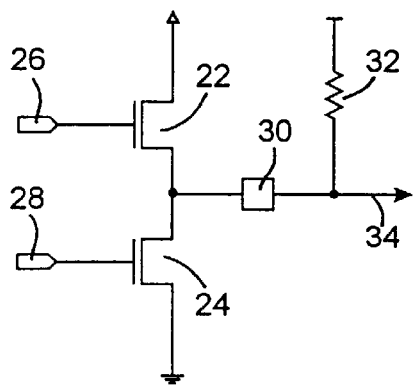
FIG. 2 is a semi-schematic diagram of an exemplary output driver, employing an N-channel pull-up device and an N-channel pull-down device.

Turning now to FIG. 2, a simplified output driver such as are found on conventional SCSI controller chips, is depicted generally at 20. The output driver 20 suitably comprises an N-channel pull-up transistor 22 and an N-channel pull-down transistor 24, each of which have their respective gate terminals connected to a pre driver circuit (not shown) as is common in the art. The N-channel pull-up transistor 22 is gate coupled to an input node 26 which receives a signal from a pull-up pre driver, while the N-channel pull-down transistor 24 is gate coupled to an input node 28 which receives a signal from a pull-down pre driver. A pad 30 receives an output signal from the output driver and is coupled, in turn, to a particular signal line of the SCSI bus.

As was described above, in connection with SCSI bus characteristics, the signal lines on the SCSI bus are terminated. In the embodiment of FIG. 2, a resistor 32 is coupled between the SCSI signal line 34 and a voltage source, preferably at 2.5 volts. Accordingly, it will be understood that the terminator will pull the signal line 34 up to 2.5 volts in the absence of appropriate signals on the pull-up node 26 or pull-down node 28, i.e., when the chip hosting the output driver 20 is turned off. Also, in accordance with convention, the signal lines of the SCSI bus are asserted as an active-low. Accordingly, signals are asserted when the pull-down transistor 24 is active. It will be understood that N-channel pull down transistor 24 turns on in response to a logical high signal provided by the pull-down pre driver on the pull-down input node 28. Likewise, the pull-up N-channel transistor 22 is turned-on in response to a logic high signal provided by the pull-up pre driver on the pull-up input node 26. As the pull-up N-channel 22 turns on, the voltage at pad 30 and the signal line 34 will be pulled-up first to approximately 2.5 V by the terminator and then to some voltage approaching the power supply voltage coupled to the N-channel pull-up transistor 22 preferably about 3.3 volts.

In accordance with practice of the invention, it should be mentioned here that the pull-down N-channel transistor 24 is required by the SCSI specification to be able to sink 45 to 60 milliamps of current when active. In order to sink this amount of current, an MOS transistor such as the pull-down N-channel transistor 24, must be designed and fabricated with rather large channel widths, because of the well-known dependence of $I_{DS}$ to the W/L ratio. Typical embodiments of output drivers suitable for use on an SCSI bus have pull-down transistors with channel areas (more technically gate areas) in the range of about 1600 square microns with typical gate lengths (L) in the range of about 0.9 microns. In order to modify the turn-on characteristics (the slew rate) of such a large device, it will be necessary to recognize that the switching characteristics are controlled by the charging and discharging time of the gate capacitance which is in turn, a function of the charge current provided to the device.

Figure 3:
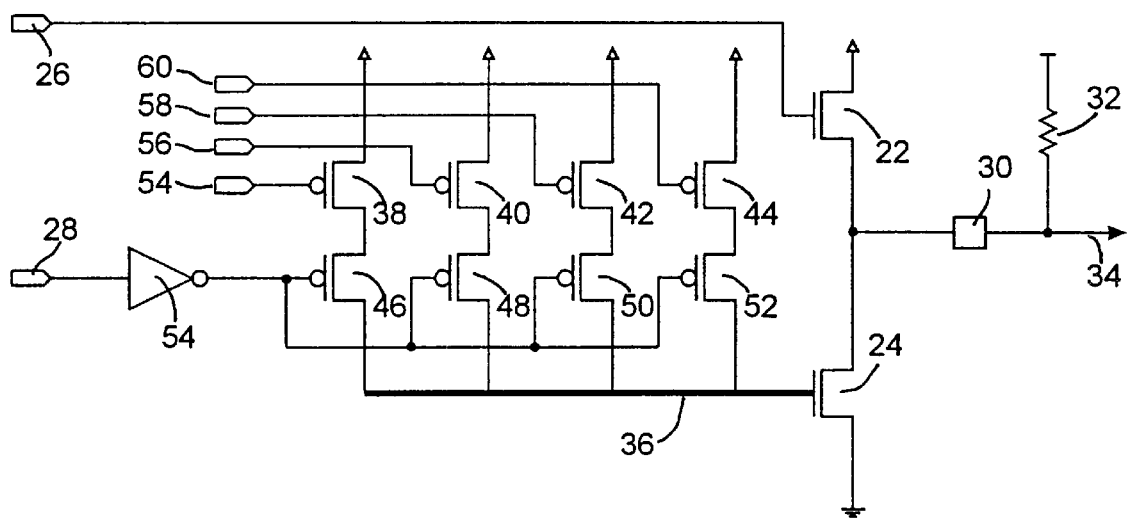
FIG. 3 is a semi-schematic diagram of a stacked P-channel transistor structure to control fall time slew rate in accordance with practice of principles of the invention.

Turning now to FIG. 3, there is depicted a circuit in accordance with the practice of the invention which controls the slew rate of an output driver pull-down transistor by adjusting the charge current provided to the gate terminal of the pull-down transistor and thus, its charge time.

Since the circuit embodiment of FIG. 3 is provided in combination with an output driver, the elements of the output driver portion of the circuit are identified with the same numerals as corresponding elements of the exemplary output driver of FIG. 2. Accordingly, the embodiment of FIG. 3 comprises an N-channel pull-up transistor 22 and an N-channel pull-down transistor 24 which in combination define an output coupled to a pad 30 which is in turn, connected to a signal line 34 of an SCSI bus. As was the case in connection with FIG. 2, the signal line 34 is an active-low signal line, coupled to an approximately 2.5 volt supply through a pull-up terminating resistor 32. The gate terminal of the pull-up N-channel transistor 22 is connected to a pull-up input 26 which is coupled in turn to a pull-up pre driver (not shown).

Advantageously, the gate terminal of the pull-down N-channel transistor 24 is connected to, and controlled by, what will be termed herein a current bus 36. Adjustable charge current is provided to current bus 36 by a parallel array of stacked P-channel transistors, with each P-channel stack comprising a pair of series connected transistors; a first, control P-channel transistor, 38, 40, 42 and 44 respectively, and a second current-source P-channel transistor, 46, 48, 50 and 52 respectively. Each of the control PFETs, 38, 40, 42 and 44 have their respective gate terminals connected to a corresponding one of an array of mutually exclusive control lines, 54, 56, 58 and 60. In a manner well understood in the art, when any of the mutually exclusive control lines 54, 56, 58 and 60 respectively, are pulled down, or set to a logical low, the corresponding control PFET will be turned on, thus reflecting a supply voltage to its respective current-source transistor of the stack (approximately 5.0 volts in the illustrated embodiment, but could equally be 3.3 volts in certain low-power applications).

Each of the respective current source PFETs, 46, 48, 50 and 52 respectively, have their gate terminals connected in common and coupled to a pull-down input node 28 connected in turn, to the pull-down pre driver (not shown). In the illustrated embodiment of FIG. 3, the pull-down input node 28 is connected to the current source PFET gates through an inverter 54. Since signals from conventional pull-down pre drivers go high in order to activate an N-channel pull-down transistor, the pre driver signal must be inverted to a logical low in order to turn-on the current source PFET transistors, 46, 48, 50 and 52.

It will be thus seen that all of the current source P-channel transistors, 46, 48, 50 and 52 are in the on-state when the pull-down pre driver asserts an active high on the pull-down input node 28. Which of the current source P-channel transistors are selected to actually conduct and thus provide charge current to the current bus 36, is determined by which of the control P-channel transistors 38, 40, 42 and 44 are selected by an appropriate logic low on one of the mutually exclusive control lines 54, 56, 58 and 60. In order to adjust the charge current provided to the pull-down transistor 24, each of the current source P-channel transistors, 46, 48, 50 and 52 are designed and constructed to source a different amount of current. Specifically, each of the current source P-channel transistors are preferably constructed with a gate width of about 20 microns, but with varying gate lengths in accordance with the invention.

The relationship between device current and gate (more properly channel) geometry is well understood in the field of MOS circuit design, and may be expressed in rather simplified form as:

$$I=k'W/L$$

Several additional terms have been intentionally omitted from the expression, but it will be recognized that the expressed relationship holds, i.e., current (I) is proportional to geometric aspect ratio (W/L). In accordance with the invention, the geometrical aspect ratios of the current source P-channel transistors 46, 48, 50 and 52 are adjusted by varying their design gate (channel) lengths (L). In particular, the first current source P-channel transistor 46 is preferably constructed with a gate width (W) of 20 microns and a gate length (L) of about 1.5 microns, to give an aspect ratio (W/L) of about 13.33. The next current source P-channel transistor 48 is preferably constructed with a gate width (W) of 20 microns and a gate length (L) of about 1.9 microns to give an aspect ratio (W/L) of about 10.5. Similarly, the next P-channel transistor 50 is constructed with a W of 20 microns and an L of 2.3 microns for a W/L ratio of about 8.7, and the next current source P-channel transistor 52 is constructed with a W of 20 microns and an L of 2.5 microns to give an aspect ratio of 8. Dimensional in this analysis in combination with an evaluation of the current/geometry relationship, above, indicates that the last-mentioned current source P-channel transistor 52 would necessarily provide the smallest amount of charge current to the current bus 36 when its control PFET 44 was turned on by an appropriate signal on control line 60. By virtue of its smaller gate (channel) length (L), the next current source P-channel transistor 50 would provide an approximately 10% greater amount of current to the current bus 36 than would the first current source P-channel transistor 52.

In accordance with the invention, the next P-channel current source transistor 48 would provide an approximately 30% increase in the charge current provided to the current bus 36, while the P-channel current source transistor with the largest aspect ratio, transistor 46, would provide an approximately 66% greater amount of current to the current bus 36 than would the P-channel current source transistor with the lowest aspect ratio (transistor 52).

Selection of which current source transistor to use to provide charge current to the pull-down transistor 24 is determined by selecting one of the four mutually exclusive control lines 54, 56, 58 and 60. One of the four control signals will be asserted to a logical low, while the remaining three will be held at a logical high. The control signals may be provided by for example, a microprocessor operating under software or firmware program control or alternatively, the control signals may be provided by the SCSI controller itself in response to an intelligent interrogation of the SCSI bus in order to determine its population and therefore, loading. The control signals 54, 56, 58 and 60 may be provided in accordance with any one of a variety of methods well understood by those having skill in the art of circuit design. Their actual physical source is immaterial to the present invention as is the interrogation and/or assertion procedures used to derive them. Indeed, it can be seen that mutually exclusive control signals having the desired logical characteristics may be implemented by a user manually configuring numbers on a circuit board after visually inspecting the number of devices connected to an SCSI cable. It should also bear mentioning here, that an SCSI controller chip comprises a multiplicity of output drivers, each connected to its own signal line of an SCSI bus. Since each of the signal lines of the bus would be expected to have the same loading characteristics, each of the output drivers of an SCSI controller chip would also comprise the adjustable pull-down slew rate circuit of the embodiment of FIG. 3. It will be understood that the control lines 54, 56, 58 and 60 would control a multiplicity of adjustable pull-down slew rate circuits by being connected in parallel to the various corresponding P-channel current stacks in each output driver circuit.

Figure 4:
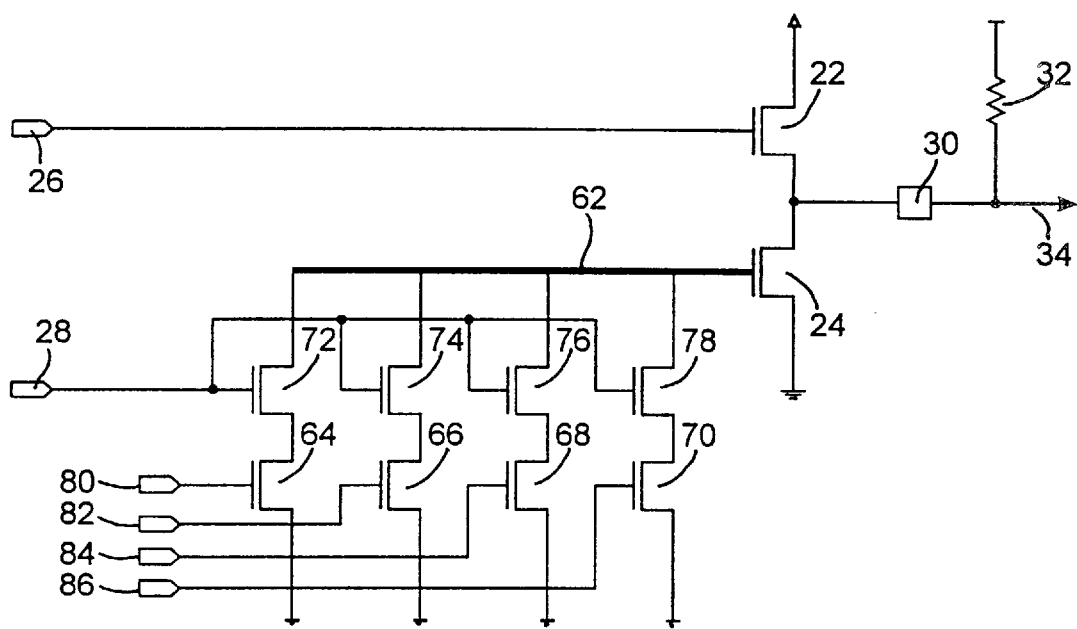
FIG. 4 is semi-schematic diagram of a stacked N-channel structure to control rise time slew rate in accordance with practice of principles of the invention.

Turning now to FIG. 4, there is depicted an exemplary embodiment of an adjustable pull-up slew rate circuit in accordance with practice of the principles of the present invention. As was the case with the embodiment of FIG. 3, the embodiment of FIG. 4 comprises an output driver, the elements of which are designated with the same reference numerals as corresponding elements in the illustrated embodiments of FIGS. 2 and 3. The output driver of FIG. 4 suitably comprises a pull-up N-channel transistor 22, gate controlled by a pull-up input node 26, and a pull-down N-channel transistor 24. The output node is connected to a pad 30 which is coupled in turn, to an SCSI bus signal line 34 terminated by a pull-up resistor 32 to a 2.5 volt supply.

In contrast to the paradigm for pull-down slew rate, the controlling factor for the slew rate of a high going signal is not necessarily dependent on the switching characteristics of the N-channel pull-up transistor 22 of the output driver. Those having skill in the art of SCSI circuit design will recognize that indeed, the termination scheme used by the vast majority of SCSI busses causes an inherently fast rising signal slew rate, at least to the termination voltage of approximately 2.5 volts. The N-channel pull-up transistor 22 of SCSI controller output drivers is provided mainly to pull the output signal up to an additional value above the termination value, most commonly to the value of about 3.5 volts. Rising signal slew rates are thus seen to be dependent on the circuit characteristics of the terminator rather than the characteristics of the N-channel pull-up transistor 22.

In accordance with the present invention, rising signal slew rate may be controlled by adjusting the turn-off time of the N-channel pull-down transistor 24. Increasing the pull-down transistor's turn off time has the effect of resisting the pull-up tendencies of the terminator and decreasing the slope of the leading edge of a rising signal. In the illustrated embodiment of FIG. 4, adjusting the turn off characteristics of the pull-down transistor 24 is accomplished by adjusting the discharge time of the gate capacitance of the transistor and thus, the rate at which the terminator may pull the signal line 34 up to the termination voltage.

In accordance with the invention, means for adjusting the discharge rate of the gate capacitor of the N-channel pull-down transistor 24 comprises a current bus 62 coupled to the gate of the pull-down transistor 24. A parallel array of N-channel transistor stacks is coupled to the current bus 62, with each stack comprising a pair of series connected N-channel transistors; a first, control N-channel transistor 64, 66, 68 and 70, and a second current sink N-channel transistor 72, 74, 77 and 78. Each N-channel pair in each stack are connected in series and coupled between the current bus 62 and either ground potential or a low supply voltage ($V_{SS}$). Each of the current sink N-channel transistors 72, 74, 76 and 78 have their gate terminals connected in common and to a pull-down input node 28 which is in turn, connected to a pull-down pre driver (not shown) in conventional fashion. It will be thus seen that when the pull-down input node 28 is asserted to an active high, the gate terminals of the current sink transistors 72, 74, 76 and 78 will each be asserted to a high state, thus turning each of the current sink transistors potentially on.

In a manner similar to that described in connection with FIG. 3 above, each of the gate terminals of the control N-channel transistor 64, 66, 68 and 70 are individually coupled to a respective one of four mutually exclusive control lines 80, 82, 84 and 86. The control lines allow individual ones of the control N-channel transistors to be turned on, thus allowing their associated current sink N-channel transistors to conduct current from the current bus 62 to ground, thus discharging the gate capacitor of the N-channel pull-down transistor 24. The discharge rate is necessarily controlled by the amount of current each of the current sink transistors is able to conduct once its leg has been selected by activating its associated control transistor. In a manner similar to that described in connection with the P-channel current source transistors in FIG. 3 above, the current sink transistors are provided at various W/L ratios in order to provide differing speeds at which the pull-down transistor gate capacitance may be discharged. The control N-channel transistor 64, 66, 68 and 70 are each designed and constructed with minimum L's (in the embodiment of the invention 0.5 microns) and W's of about 10 microns in order to have sufficient current handling capacity as well as a fast switching time. The current sink N-channel transistors 72, 74, 76 and 78 are each designed and constructed with a width (W) of 10 microns and varying L's to give thereby W/L ratios of about 3.1 to about 14.3. The first current sink transistor 72 is constructed with a W of about 10 microns and an L of about 0.7 microns, the next current sink transistor 74 is constructed with a W of 10 microns and an L of about 1.2 microns, the next sink transistor 76 is constructed with a W of about 10 microns and an L of about 2.2 microns, while the remaining current sink transistor 78 is constructed with a W of about 10 microns and an L of about 3.2 microns.

It should be noted here that the W's of the N-channel current sink transistors are approximately ½ that of the W's of the current source P-channel transistors because the k' of an N-channel is about twice the k' of a P-channel transistor. Accordingly, if the current sinking capability of each of the current sink transistors is normalized to the sink transistor 78 having the smallest aspect ratio, it will be seen that the current sink transistor having the next largest aspect ratio, transistor 76, would be able to sink approximately 1.44 times the amount of current as the base transistor, transistor 78. Likewise, the sink transistor with the next largest aspect ratio, transistor 74, is able to sink approximately 2.69 times the amount of current as the base transistor, while the sink transistor with the largest aspect ratio, transistor 72, is able to sink approximately 4.6 times the amount of current as the base transistor 78. Selection of the appropriate N-channel sink transistor 72, 74, 76 or 78 is effected by applying an appropriate logical high signal on a selected one of the four, mutually exclusive control lines 80, 82, 84 and 86. In accordance with the invention, these control lines may be initially the same as the control lines controlling selection of the P-channel current source transistors in FIG. 3 but connected through inverting buffers (not shown) in order to maintain the appropriate turn-on polarity. In other words control line 80 of FIG. 4 may be connected to control line 54 of FIG. 3; control line 82 of FIG. 4 may be connected to control line 56 of FIG. 3; control line 84 of FIG. 4 may be connected to control line 58 of FIG. 3; and control line 86 of FIG. 4 may be connected to control line 60 of FIG. 3, each through a corresponding inverting buffer. Accordingly, slew rate adjustment may be had for both rising and falling edges of a signal with the assertion of only one of four control signals which in turn, selects either a fast, high current charge and/or discharge leg, a slow, low current, charge/discharge leg, or one of two intermediate charge/discharge legs, depending on the population of an SCSI bus, and thus, its loading.

It will also be evident from the foregoing, that the current bus 62 of FIG. 4 is directly equivalent to and may, indeed, be the same as the current bus 36 of FIG. 3. The P-channel current source transistor stacks may be connected between a supply voltage $V_{D.D.}$ and the current bus in the manner depicted in FIG. 3, while the current sink N-channel transistor stacks depicted in FIG. 4 may be connected between the identical current bus and a lower supply voltage $V_{SS}$ and/or ground potential. The pull-down input node 28 appropriately provides a signal from a pull-down pre driver (not shown) to the gates of both the P-channel current source arrays and the N-channel current sink array.

It also bears mentioning that the illustrated embodiments depict a four step array for both current source and current sink control for falling and rising edges of an output, respectively. A greater or fewer number of source or sink stacks may easily be provided in accordance with the invention, in order to achieve either economy of cost on the one hand, or a greater degree of adjustment resolution on the other. It will also be evident to one having skill in the art that adjusting the amount of current sourced or sunk by a P-channel or N-channel array need not be varied as a function of variable W/L ratios. Indeed, each of the current source and/or current sink transistors could be constructed with uniform W/L ratios and additively combined, in parallel fashion, to either source or sink current from the current bus. In this case, the control signals would not necessarily be mutually exclusive. Rather, they might be coupled to logic circuitry which would combinatorially enable the control lines, such that the resulting current source and/or current sink capability of the slew rate adjustment circuit would vary monotonically (1×, 2×, 3×, and 4×).

In accordance with practice of principles of the present invention, a circuit has been described which is able to adjust the slew rate of rising and falling edges of an output signal provided by an output driver to an SCSI bus. The slew rate adjustment is accomplished by selectively and variably controlling the charge and discharge rate of the gate capacitance of an N-channel pull down transistor comprising the output driver. Variable charging and discharging rates are controlled by switching selected ones of a multiplicity of varying current sourcing and/or current sinking transistors onto a current bus coupled in turn, to the gate terminal of the N-channel pull-down transistor of the output driver.

It is contemplated that the slew rate adjustment circuit be implemented as part of a single monolithic CMOS SCSI integrated circuit, but it will be recognized that this is merely a convenient vehicle for describing the invention. A circuit having identical functionality may be implemented as a combination of resistors and switches, may be implemented in bipolar technology and may be implemented with individual discrete transistors as opposed to monolithic circuit.

The above description of an exemplary embodiment of an output driver with adjustable slew rate control is for illustrative purposes. Because of variations which will be apparent to one having skill in the art, the present invention is not intended to be limited to the particular embodiments described above. Such variations and other modifications and alterations are included within the scope and intent of the invention as described in the following claims.

We claim:

1. An integrated circuit for adaptive adjustable slew rate control for rising and falling edges of an output driver signal, the output driver coupled to a terminated SCSI bus, the integrated circuit comprising:

an output driver including an N-channel pull-up transistor and an N-channel pull-down transistor, the pull-down transistor having a turn-on slew rate in operative response to a charge current provided on a gate terminal, the pull-down transistor further having a turn-off slew rate in operative response to a discharge current provided on said gate terminal;

a current bus coupled to the gate terminal of the pull-down transistor;

means for providing an adjustable charge current to the current bus and thus the gate terminal of the pull-down transistor, the adjustable charge current means further for sourcing a preselected one of a multiplicity of source currents to the current bus, the pull-down transistor exhibiting a corresponding one of a multiplicity of downward going turn-on slew rates in operative response thereto, the means for providing an adjustable charge current further comprising a parallel array of stacked P-channel transistors, each P-channel transistor stack further comprising a pair of P-channel transistors connected in series-fashion between a sower supply voltage and the current bus; and means for providing an adjustable discharge current to the bus and thus the gate terminal of the pull-down transistor, the adjustable discharge current means further for sinking a preselected one of a multiplicity of sink currents to the current bus, the pull-down transistor exhibiting a corresponding one of a multiplicity of upward going turn-off slew rates in operative response thereto.

2. The integrated circuit according to claim 1, wherein the means for providing an adjustable discharge current comprises a parallel array of stacked N-channel transistors, each N-channel transistor stack further comprising a pair of N-channel transistors connected in series-fashion between the current bus and a ground potential.

3. The integrated circuit of claim 1, wherein each P-channel transistor stack comprises a first, control transistor and a second, source transistor, each control transistor having a gate electrode configured to receive a respective one of a multiplicity of mutually exclusive control signals, each control signal activating a respective one of the control transistors, thus activating the respective P-channel transistor stack so as to source current to the current bus.

4. The integrated circuit according to claim 2, wherein each N-channel transistor stack comprises a first, control transistor and a second, sink transistor, each control transistor having a gate electrode configured to receive a respective one of a multiplicity of mutually exclusive control signals, each control signal activating a respective one of the control transistors, thus activating the respective N-channel transistor stack so as to sink current from the current bus.

5. The integrated circuit according to claim 3, wherein each source transistor includes a gate terminal, each gate terminal connected in common and to an input signal, each respective one of the multiplicity of source transistors are constructed with a W/L ratio, the W/L ratio of the source transistors in the array increasing such that each respective source transistor sources a predetermined and different amount of current than a next respective source transistor.

6. The integrated circuit according to claim 4, wherein each sink transistor includes a gate terminal, each gate terminal connected in common and to an input signal, each respective one of the multiplicity of sink transistors are constructed with a W/L ratio, the W/L ratio of the sink transistors in the array increasing such that each respective sink transistor sinks a predetermined and different amount of current than a next respective sink transistor.

7. The integrated circuit according to claims 5 or 6, wherein each respective one of the multiplicity of currents is individually selectable by activation of a corresponding one of said multiplicity of control transistors corresponding to the respective transistor stacks.

8. An integrated circuit for adaptive adjustable slew rate control for rising and falling edges of an output driver signal, the output driver coupled to a terminated SCSI bus, the integrated circuit comprising:

an output driver including an N-channel pull-up transistor and an N-channel pull-down transistor, the pull-down transistor having a turn-on slew rate in operative response to a charge current provided on a gate terminal, the pull-down transistor further having a turn-off slew rate in operative response to a discharge current provided on said gate terminal;

a current bus coupled to the gate terminal of the pull-down transistor;

a parallel array of stacked P-channel transistors, each P-channel transistor stack comprising a first control transistor and a second current source transistor connected in series-fashion, the parallel array of stacked P-channel transistors coupled between a power supply voltage and the current bus; and a parallel array of stacked N-channel transistors, each N-channel transistor stack including a first control transistor and a second current sink transistor connected in series-fashion, the parallel array of stacked N-channel transistors coupled between the current bus and a ground potential.

9. The integrated circuit according to claim 8, wherein each control transistor includes a gate terminal, each gate terminal connected to a corresponding one of a multiplicity of mutually exclusive control lines, such that when any respective one of the mutually exclusive control lines is asserted, the corresponding control transistor will be activated.

10. The integrated circuit according to claim 9, wherein each current source transistor of the stacked P-channel array includes a gate terminal, the gate terminals of said current source transistors connected in common and to an input signal, such that when the input signal is asserted, all of the source transistors are configured to be in the on state, and wherein selected ones of the P-channel transistor stacks provide a source current to the current bus when the corresponding control transistor is activated by said mutually exclusive control lines.

11. The integrated circuit according to claim 10, wherein each current sink transistor of the stacked N-channel array includes a gate terminal, the gate terminals of said current sink transistors connected in common and to an input signal, such that when the input signal is deasserted, all of the sink transistors are configured to be in the on state, and wherein selected ones of the N-channel transistor stacks conduct a sink current from the current bus when the corresponding control transistor is activated by said mutually exclusive control lines.

12. The integrated circuit according to claim 10, wherein each P-channel source transistor is constructed with a W/L ratio, each P-channel source transistor having a different W/L ratio, such that each P-channel transistor stack provides a different, pre-determined source current to the current bus upon activation of its corresponding control transistor to thereby provide a charge current to the N-channel pull-down transistor, thus adjusting its turn-on slew rate in operative response thereto.

13. The integrated circuit according to claim 11, wherein each N-channel sink transistor is constructed with a W/L ratio, each N-channel sink transistor having a different W/L ratio, such that each N-channel transistor stack conducts a different, pre-determined sink current from the current bus upon activation of its corresponding control transistor to thereby provide a discharge current to the N-channel pull-down transistor, thus adjusting its turn-off slew rate in operative response thereto.

14. A method for adaptively adjusting the slew rate of rising and falling edges of an output driver signal, the output driver coupled to a terminated SCSI bus, the method comprising:

providing an output driver including an N-channel pull-up transistor and an N-channel pull-down transistor, the pull-down transistor having a turn-on slew rate in operative response to a charge current provided on a gate terminal, the pull-down transistor further having a turn-off slew rate in operative response to a discharge current provided on said gate terminal;

providing a current bus, wherein the current bus is coupled to the gate terminal of the pull-down transistor;

providing a parallel array of stacked P-channel transistors, each P-channel stack comprising a first control transistor and a second current source transistor connected in series-fashion, the parallel array of stacked P-channel transistors coupled between a power supply voltage and the current bus, wherein each P-channel control transistor includes a gate terminal connected to a corresponding one of a multiplicity of mutually exclusive control lines, such that when any respective one of the mutually exclusive control lines is asserted, the corresponding control transistor will be activated;

providing a parallel array of stacked N-channel transistors, each N-channel transistor stack including a first control transistor and a second current sink transistor connected in series-fashion, the parallel array of stacked N-channel transistors coupled between the current bus and a ground potential, wherein each N-channel control transistor includes a gate terminal connected to a corresponding one of a multiplicity of mutually exclusive control lines, such that when any respective one of the mutually exclusive control lines is asserted, the corresponding control transistor will be activated; and activating selective ones of the mutually exclusive control lines, to thereby provide an adjustable current to the current bus and thereby the gate terminal of the pull-down transistor.

15. The method according to claim 14, wherein each P-channel source transistor is constructed with a W/L ratio, each P-channel source transistor having a different W/L ratio, such that each P-channel transistor stack provides a different, pre-determined source current to the current bus upon activation of its corresponding control transistor to thereby provide a charge current to the N-channel pull-down transistor, thus adjusting its turn-on slew rate in operative response thereto.

16. The method according to claim 15, wherein each N-channel sink transistor is constructed with a W/L ratio, each N-channel sink transistor having a different W/L ratio, each N-channel sink transistor having a different W/L ratio, such that each N-channel transistor stack conducts a different, pre-determined sink current from the current bus upon activation of its corresponding control transistor to thereby provide a discharge current to the N-channel pull-down transistor, thus adjusting its turn-off slew rate in operative response thereto.

17. The method according to claim 16, wherein each respective one of the multiplicity of the mutually exclusive control lines coupled to each P-channel control transistor correspond to respective ones of the multiplicity of mutually exclusive control lines coupled to each N-channel control transistor.

* * * * *